(12) United States Patent
Wu (10) Patent No.: US 6,699,800 B2
(45) Date of Patent: Mar. 2, 2004

(54) PATTERN DESIGN METHOD FOR LITHOGRAPHY C/H PROCESS

(75) Inventor: Yuan-Hsun Wu, Chungli (TW)

(73) Assignee: Nanya Technology Corporation, Taoyuan (TW)

( * ) Notice: Subject to any disclaimer, the term of this patent is extended or adjusted under 35 U.S.C. 154(b) by 28 days.

(21) Appl. No.: 10/112,960

(22) Filed: Mar. 28, 2002

(65) Prior Publication Data

US 2003/0049946 A1 Mar. 13, 2003

(30) Foreign Application Priority Data

Aug. 30, 1999 (TW) ......................................... 090121449

(51) Int. Cl.$^7$ .............................................. H01L 21/00
(52) U.S. Cl. ....................................................... 438/947
(58) Field of Search ........................ 438/947; 430/312, 430/5

(56) References Cited

U.S. PATENT DOCUMENTS 5,766,804 A * 6/1998 Spence ........................... 430/5
5,786,115 A * 7/1998 Kawabata ....................... 430/5
6,153,357 A * 11/2000 Okamoto et al. ............. 430/312
6,337,162 B1 * 1/2002 Irie ................................ 430/5
6,534,242 B2 * 3/2003 Sugita .......................... 430/312

* cited by examiner

Primary Examiner—David Nelms
Assistant Examiner—Thao P Le
(74) Attorney, Agent, or Firm—Ladas & Parry (57) ABSTRACT

An assist pattern design method for lithography C/H process that includes the following steps: determining the exposure wavelength of a lithography machine light source; determining a minimum resolution line width by the sigma, process integration parameter and numerical aperture of the lithography machine; recovering the minimum line width on a mask according to the miniature scale of the determined minimum resolution line width; and using a line pattern smaller than the recovered minimum line width to connect multiply C/H patterns on the mask.

4 Claims, 10 Drawing Sheets

(2 of 10 Drawing Sheet(s) Filed in Color)

PATTERN DESIGN METHOD FOR LITHOGRAPHY C/H PROCESS

BACKGROUND OF THE INVENTION

1. Field of the Invention

This invention relates to a pattern design method for forming lithography contact/hole (hereinafter referred to as a "C/H") pattern, especially to form a C/H pattern with preferred depth of focus.

2. Description of the Related Art

In a typical semiconductor process, a contact/hole (hereinafter referred to as a "C/H") is formed by a C/H pattern formed on a semiconductor layer through exposure and development steps.

Figure 1A:
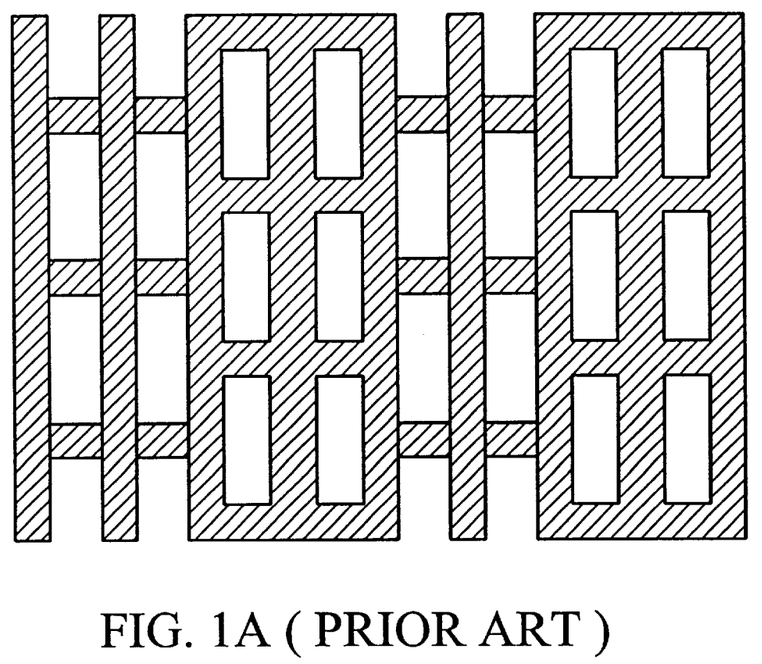
FIG. 1A is a schematic diagram illustrating the C/Hs when exposed by a ⅔ annular filter of an off-axis illumination system.
Figure 1B:
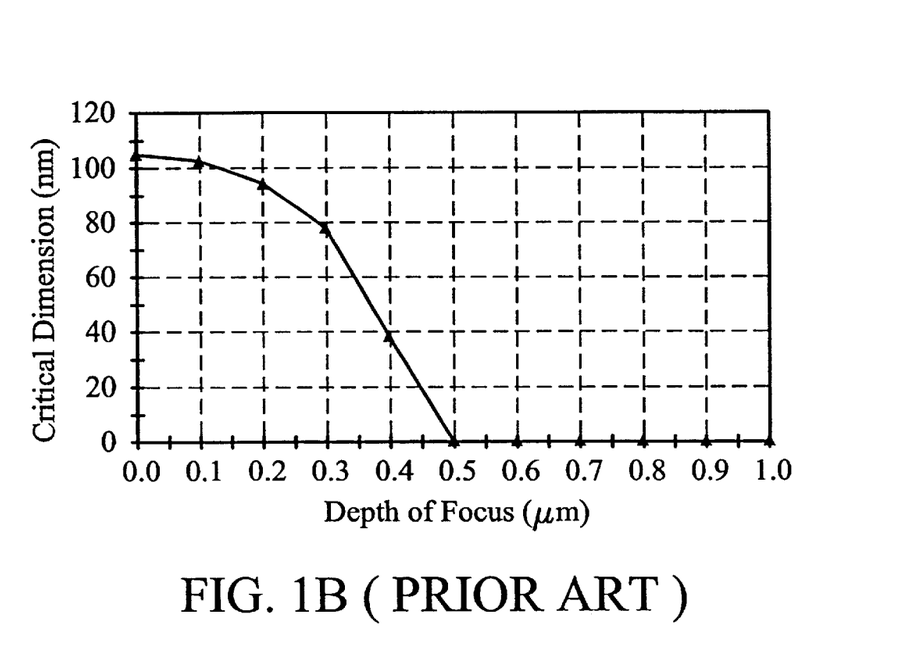
FIG. 1B is a graph of the CD-to-DOF curve after exposure by the ⅔ annular filter of the off-axis illumination system.

FIG. 1A is a schematic diagram illustrating the C/Hs formed by exposing with a ⅔ annular filter of an off-axis illumination system. FIG. 1B is a graph of the Critical Dimension (hereinafter referred to as a CD) to Depth of focus (hereinafter referred to as a DOF) curve after exposure by the ⅔ annular filter of the off-axis illumination system. Comparing FIGS. 1A and 1B, when a C/H has a dimension approximate to 105 nm±10 nm, its DOF is about 0.2 μm.

The higher resolution (i.e., the smaller line width) makes the shallower DOF when introducing the sub-micrometer process in lithography. Accordingly, the concurrent increase of resolution and depth of focus has become a research issue.

SUMMARY OF THE INVENTION

Accordingly, an object of the invention is to provide an assist pattern design method for lithography C/H process, to increase the depth of focus without lowering the resolution.

The pattern design method for lithography C/H process of the present invention includes the following steps: determining the exposure wavelength of a lithography machine light source; determining a minimum resolution line width by the sigma, process integration parameter and numerical aperture of the lithography machine; recovering the minimum line width on a mask according to the miniature scale of the determined minimum resolution line width; and using a line pattern smaller than the recovered minimum line width to connect multiple C/H patterns on the mask.

A characteristic of the present invention is the minimum resolution line width W complying with the equation:

$$W = \frac{k \times \lambda}{(1+\sigma) \times N.A.},$$

where, k is the process integration parameter; λ is the exposure wavelength of the lithography machine light source; σ is the sigma of the lithography machine; and N.A. is the numerical aperture of the optical projection system in the lithography machine (i.e., stepper).

According to the method of the present invention, the depth of focus is increased when exposing the C/Hs.

Furthermore, according to the method of the present invention, the optical proximity effect is corrected.

BRIEF DESCRIPTION OF THE DRAWINGS

The above-identified patent or application file contains at least one drawing executed in color. Copies of this patent or patent application publication with color drawings will be provided by the Office upon request and payment of necessary fee.

The invention will be apparent by referring to the following detailed description of a preferred embodiment with reference to accompanying drawings, wherein:

FIGS. 3A–3D are colored, and they are available upon request.

DETAILED DESCRIPTION OF THE INVENTION

In following, similar function elements are denoted by the same reference numerals.

Figure 2A:
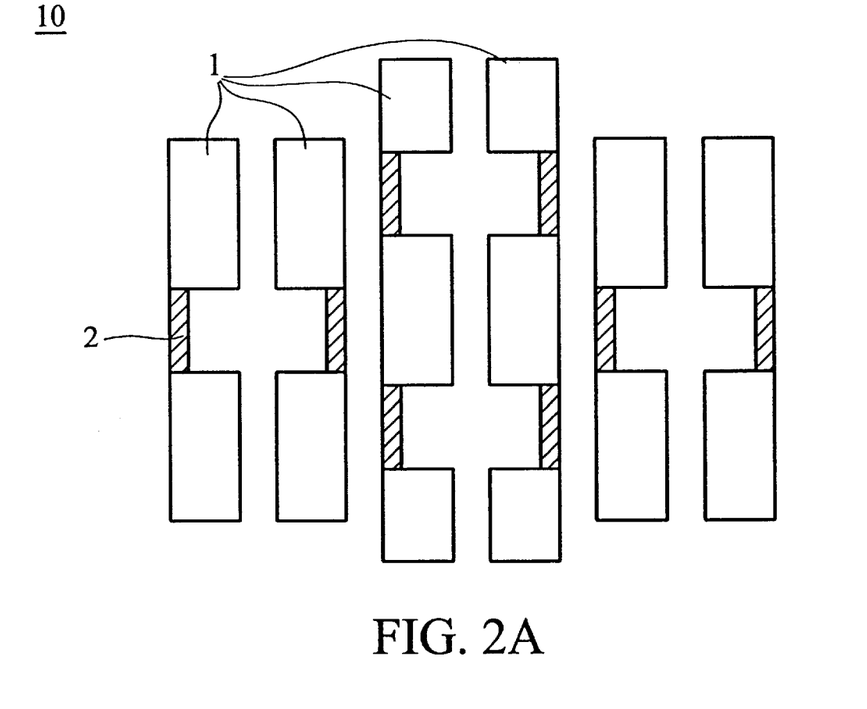
FIG. 2A is a schematic diagram of chain C/Hs with lines formed on a mask by the pattern design method for lithography C/H process of the present invention.

FIG. 2A is a schematic diagram of chain C/Hs with lines formed on a mask by the inventive assist pattern design method for lithography C/H process.

As shown in FIG. 2A, multiple hole patterns 1 on a mask 10 are connected by a line pattern 2. When the mask 10 is set in a lithography machine, in order to avoid forming a respective line pattern on a semiconductor wafer on exposure, the line pattern L on the mask has to comply with the following condition:

$$L < W/m,$$

where, W is the minimum resolution line width for exposing the line pattern on a wafer and m is a reduced scale of the mask pattern projecting on the wafer. The minimum resolution line width W will comply with the following equation:

$$W = \frac{k \times \lambda}{(1+\sigma) \times N.A.},$$

where, k is the process integration parameter; λ is the exposure wavelength of the lithography machine light source; σ is the sigma of the lithography machine; and N.A. is the numerical aperture of the optical projection system in the lithography machine. In the embodiment, k is taken from the range between 0.25 and 0.6.

In the simulation, the exposure is made by the mask pattern of FIG. 2 under the conditions: using the lithography machine with λ=248 nm, σ=0.85, k=0.4, and N.A.=0.68 and the miniature scale m=4:1. Accordingly, the minimum resolution line width W is 78.85 nm. That is to say that, the line width for connecting in series of multiple hole patterns on the mask has to be smaller than 315 nm.

EXAMPLE 1

Figure 2B:
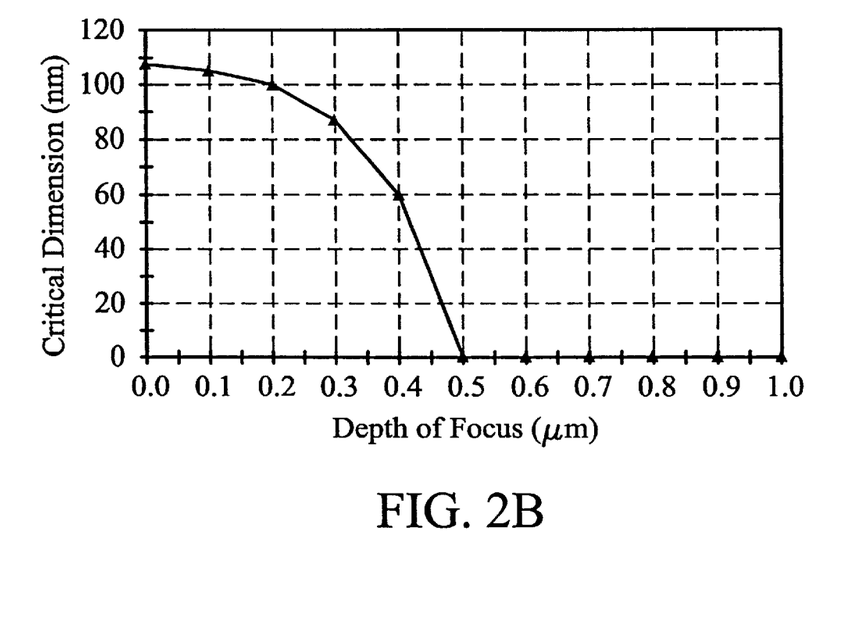
FIGS. 2B–2D respectively show graphs of different CD-to-DOP curves after exposure by the ⅔ annular filter of the off-axis illumination system, according to the present invention.
Figure 2C:
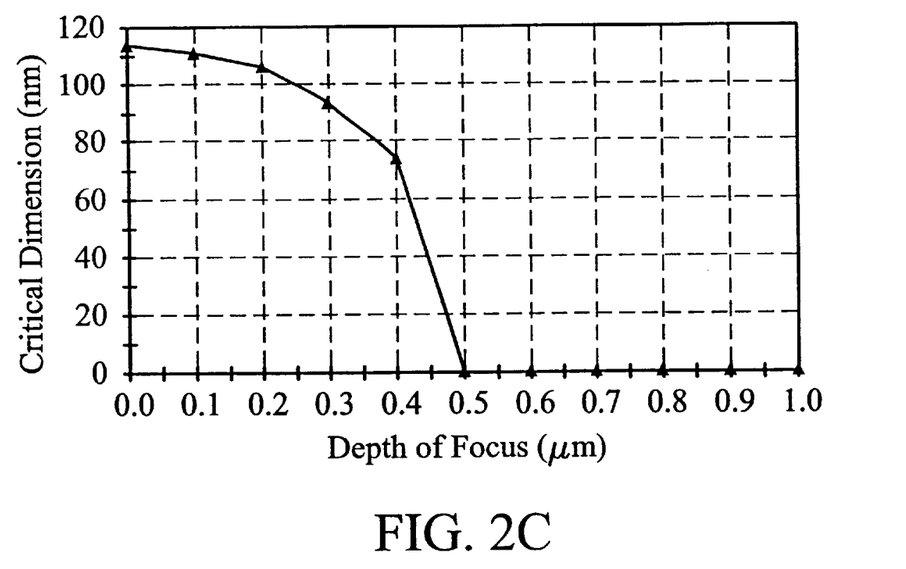
Figure 2D:
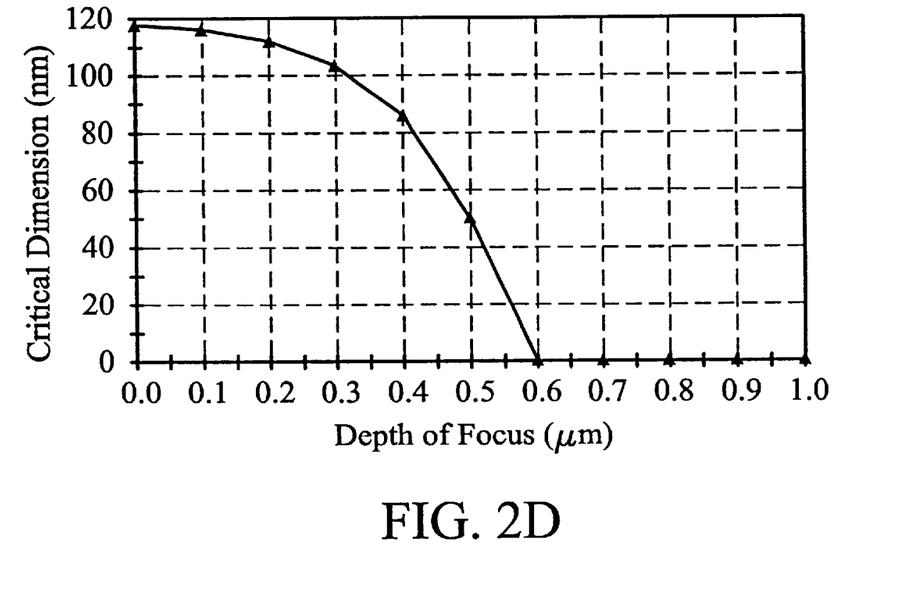

FIGS. 2B–2D respectively show graphs of different CD-to-DOP curves after exposure by the ⅔ annular filter of an off-axis illumination system, according to the present invention. FIG. 2B shows multiple hole patterns on the mask connected in series by a line pattern with a 200 nm line width. FIG. 2C shows multiple hole patterns on the mask connected in series by a line pattern with a 240 nm line width. FIG. 2D shows multiple hole patterns on the mask connected in series by a line pattern with a 280 nm line width.

As shown in FIGS. 2B–2D, the C/H DOP formed by the lithography machine is increasingly with the increasing resolution line width (critical dimension). For example, the DOP value at 100 nm is from about 0.2 μm of FIG. 2B to about 0.3 μm of FIG. 2D. As such, with the increasing line width, multiple hole patterns appear like a line/space (L/C) pattern on exposure to the lithography machine and further increase the C/H DOP. Therefore, the example 1 of the embodiment can improve the insufficient depth of focus.

EXAMPLE 2

Figure 2E:
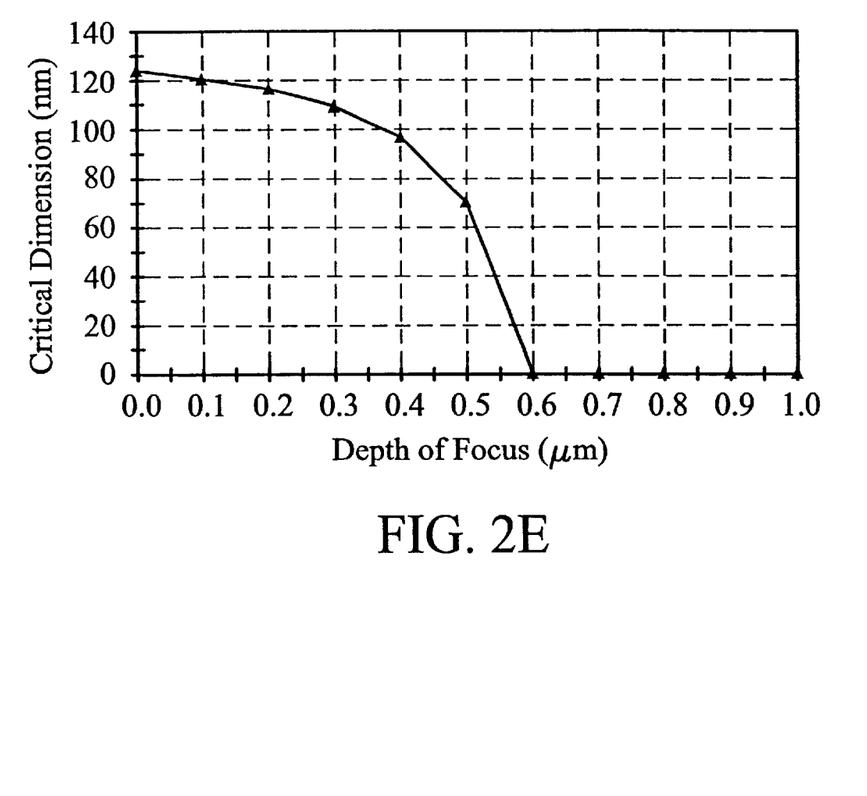
FIGS. 2E–2G respectively show graphs of different CD-to-DOP curves after exposure by an on-axis sector filter of the off-axis illumination system, according to the present invention.
Figure 2F:
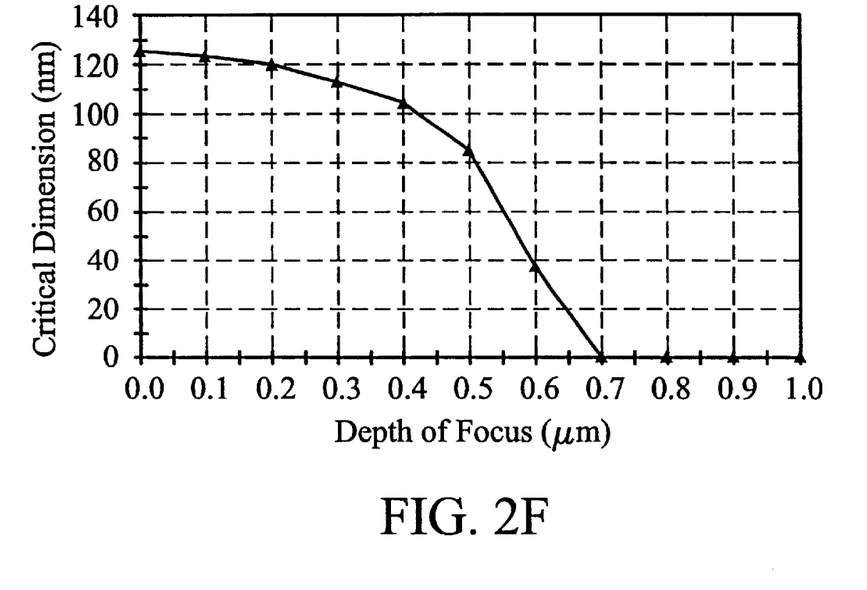
Figure 2G:
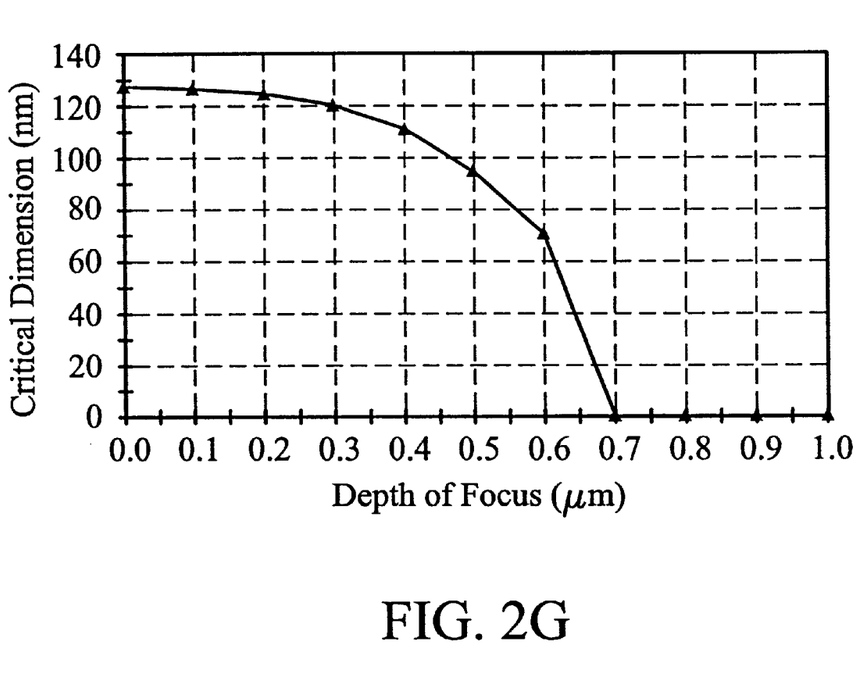

FIGS. 2E–2G respectively show graphs of different CD-to-DOP curves after exposure by an on-axis sector filter of the off-axis illumination system, according to the present invention. FIG. 2E shows multiple hole patterns on the mask connected in series by a line pattern with a 200 nm line width. FIG. 2F shows multiple hole patterns on the mask connected in series by a line pattern with a 240 nm line width. FIG. 2G shows multiple hole patterns on the mask connected in series by a line pattern with a 280 nm line width.

As shown in FIGS. 2E–2G, the C/H DOF formed by the lithography machine is increasingly with the increasing line width (critical dimension). For example, the DOP value at 100 nm is from about 0.37 μm of FIG. 2E to about 0.47 μm of FIG. 2G. As such, with the increasing line width, multiple hole patterns appear like a line/space (L/C) pattern on exposure to the lithography machine and further increase the C/H DOF. Therefore, the example 2 of the embodiment can improve the insufficient depth of focus.

Figure 3A:
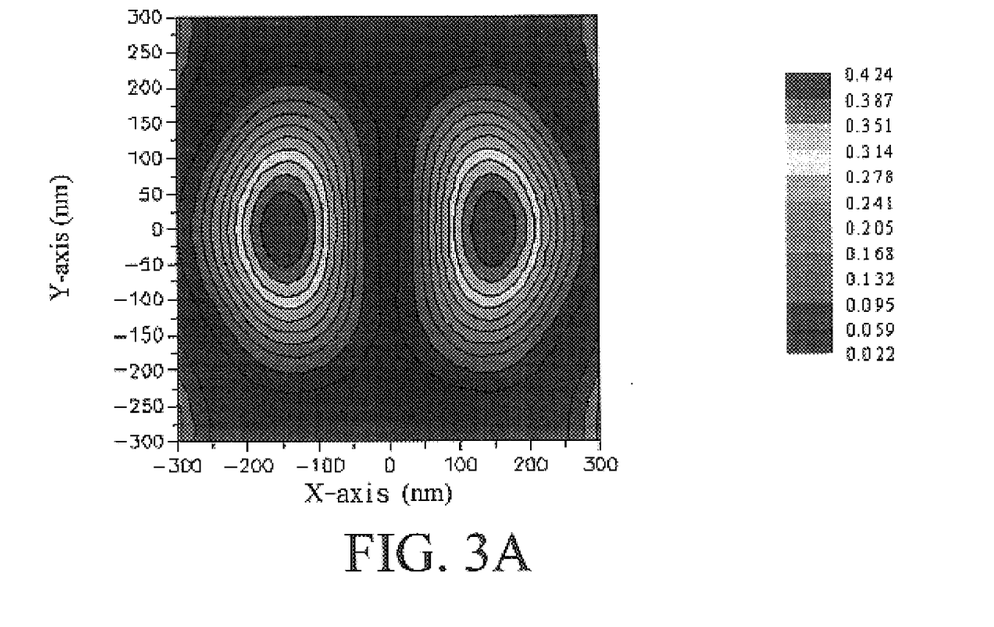
FIGS. 3A and 3B respectively show diagrams of the C/Hs formed by exposing a C/H pattern having no line pattern by means of different filters, according to the present invention.
Figure 3B:
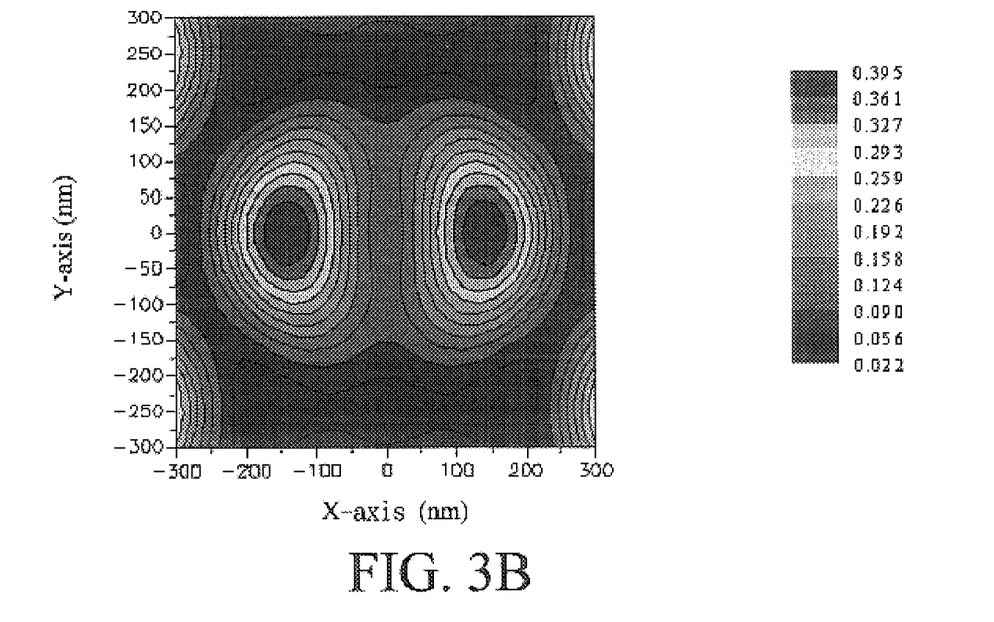
Figure 3C:
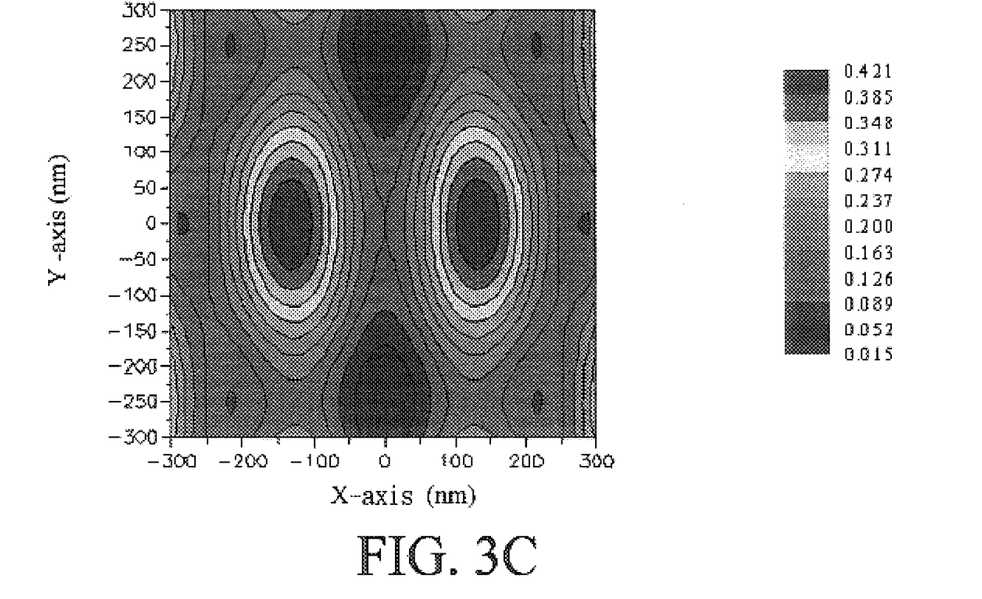
FIGS. 3C and 3D respectively show diagrams of the C/Hs formed by exposing a C/H pattern having a 70 nm line width by means of different filters, according to the present invention.
Figure 3D:
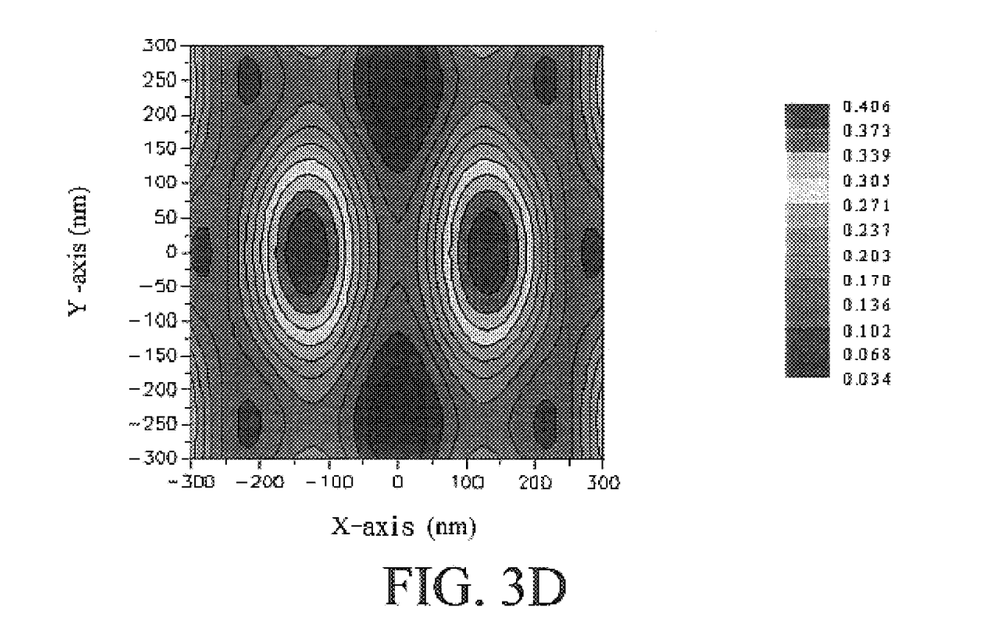

In semiconductor lithography process, the optical proximity effect, an exposure effect generating optical fault occurs frequently. FIGS. 3A and 3B respectively show diagrams of the C/Hs formed by exposing a C/H pattern having no line pattern by means of different filters, according to the present invention. As shown in FIGS. 3A and 3B, the optical proximity effect acts on the semiconductor wafer to form deformed C/Hs. FIGS. 3C and 3D respectively shows diagrams of the C/H formation by exposing a C/H pattern having a 70 nm line width by means of different filters. As shown in FIGS. 3C and 3D, the line pattern connected in series with multiple C/H patterns corrects the deformed C/Hs.

Figure 4A:
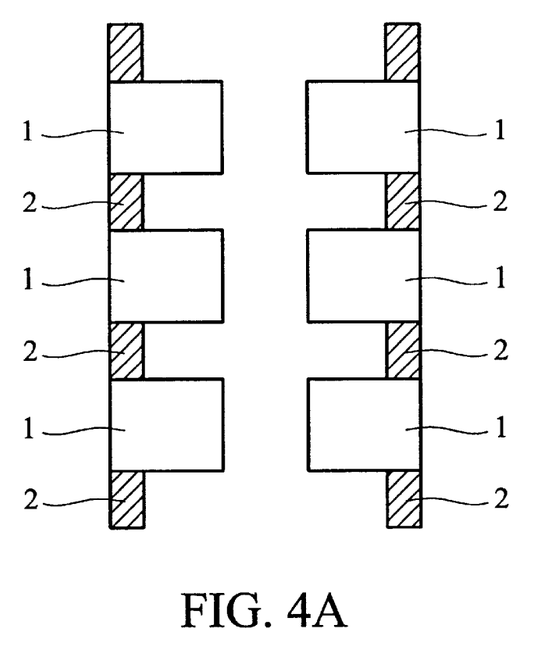
FIGS. 4A–4F respectively show diagrams of different patterns with the different combinations of the C/H and line patterns for a mask in exposure, according to the present invention.
Figure 4B:
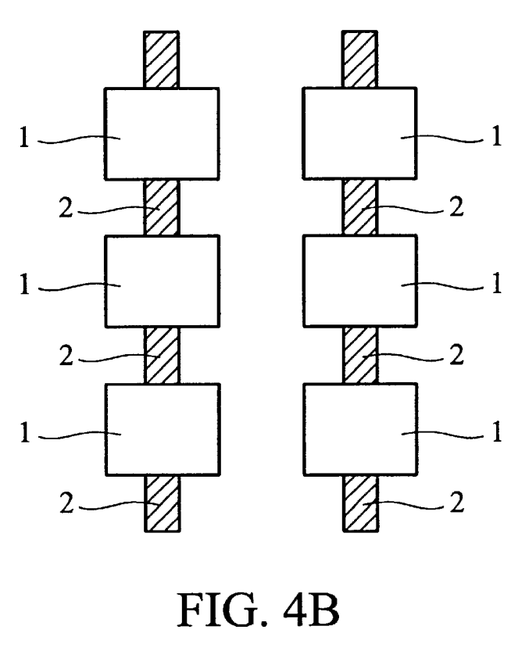
Figure 4C:
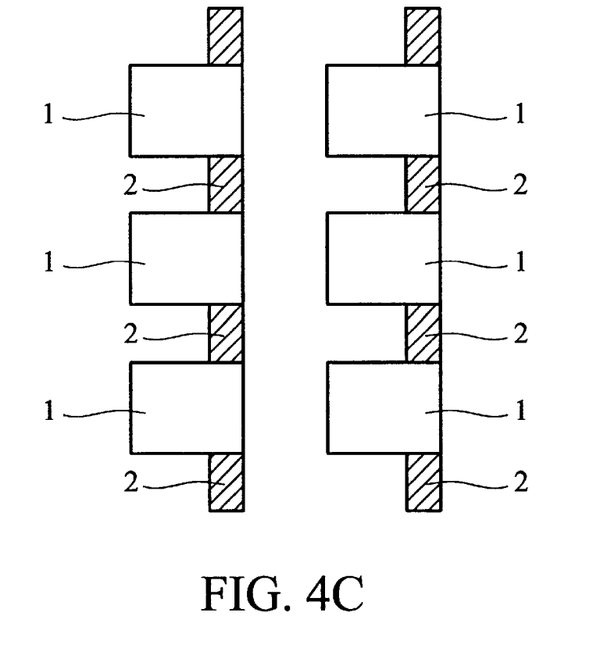
Figure 4D:
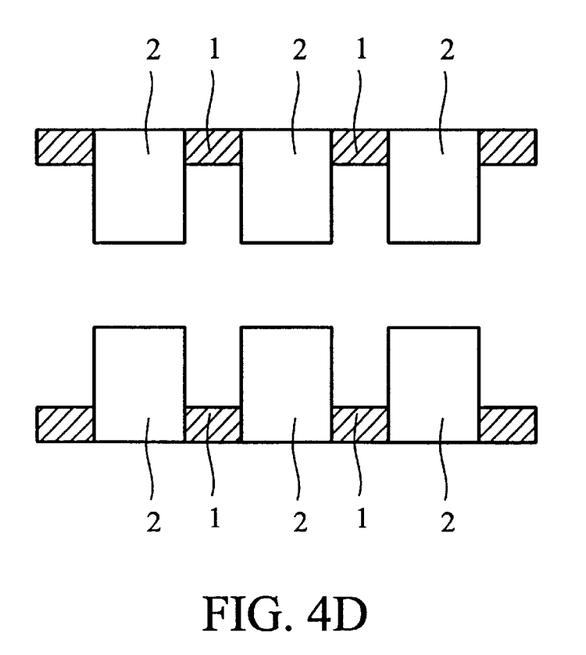
Figure 4E:
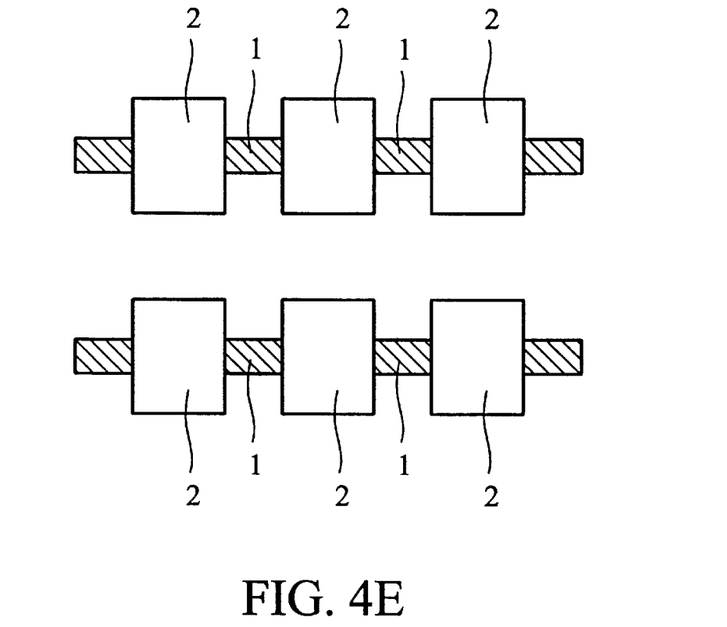
Figure 4F:
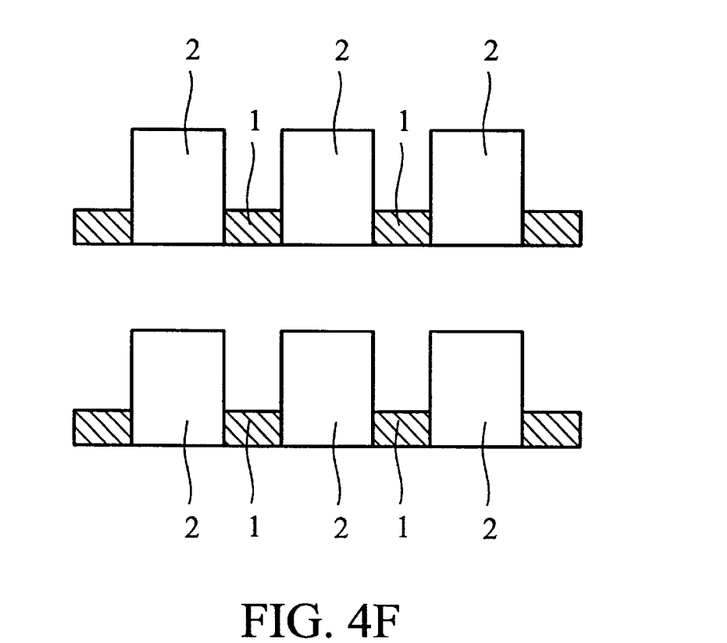

FIGS. 4A–4F respectively show diagrams of different patterns with the different combinations of the C/H and line patterns for a mask in exposure, according to the present invention. FIGS. 4A–4C show the line pattern connecting vertically to link multiply C/Hs. The line pattern can connects multiple C/Hs in a symmetric, central or lateral pattern. FIGS. 4D–4F show the line pattern connecting laterally to link multiply C/Hs. The line pattern can also connects multiple C/Hs in symmetric, central or lateral.

In the embodiment, the off-axis illumination system is used for description. However, an on-axis illumination system can also be adapted for connecting multiple C/H patterns via line pattern.

Although the invention has been described in its preferred embodiment, it is not intended to limit the invention to the precise embodiment disclosed herein. Those who are skilled in this technology can still make various alterations and modifications without departing from the scope and spirit of this invention. Therefore, the scope of the invention shall be defined and protected by the following claims and their equivalents.

What is claimed is:

1. A pattern design method for forming lithography contact/hole pattern, adapted for all exposure illumination system, comprising the steps:

determining the exposure wavelength of a lithography machine light source;

determining a minimum resolution line width by the sigma, process integration parameter and numerical aperture of the lithography machine;

recovering the minimum line width on a mask according to the reduced scale of the determined minimum resolution line width;

using a line pattern with a line width smaller than the recovered minimum line width to connect multiply contact/hole patterns on the mask.

2. The assist pattern design method for lithography contact/hole of claim 1, wherein the minimum resolution line width complies with the following equation:

$$W = \frac{k \times \lambda}{(1 + \sigma) \times N.A.},$$

where, W, is the minimum resolution line width; k is the process integration parameter; λ is the exposure wavelength of the lithography machine light source; σ is the sigma of the lithography machine; and N.A. is the numerical aperture of the optical projection system in the lithography machine.

3. The assist pattern design method for lithography contact/hole of claim 2, wherein k ranges between 0.25 and 0.6.

4. The assist pattern design method for lithography contact/hole of claim 1, wherein the line width of the line pattern, the reduced scale, and the minimum resolution line width comply with the following condition:

$$L < W/m,$$

where, L is the line width of the line pattern, W is the minimum resolution line width and m is a reduced scale of the mask pattern projecting on the wafer.

* * * * *